United States Patent
Yang et al.

(10) Patent No.: US 8,762,654 B1
(45) Date of Patent: Jun. 24, 2014

(54) SELECTIVELY SCHEDULING MEMORY ACCESSES IN PARALLEL BASED ON ACCESS SPEEDS OF MEMORY

(75) Inventors: Xueshi Yang, Sunnyvale, CA (US); Chi Kong Lee, Fremont, CA (US)

(73) Assignee: Marvell International Ltd. (BM)

( * ) Notice: Subject to any disclaimer, the term of this patent is extended or adjusted under 35 U.S.C. 154(b) by 507 days.

(21) Appl. No.: 12/484,284

(22) Filed: Jun. 15, 2009

Related U.S. Application Data

(60) Provisional application No. 61/077,769, filed on Jul. 2, 2008.

(51) Int. Cl.
| | |
|---|---|
| G06F 12/00 | (2006.01) |
| G06F 13/00 | (2006.01) |
| G06F 13/28 | (2006.01) |
| G11C 8/00 | (2006.01) |
| G11C 16/04 | (2006.01) |
| G11C 11/34 | (2006.01) |

(52) U.S. Cl.
USPC ...... 711/150; 711/103; 711/216; 365/185.03; 365/185.17; 365/230.03; 365/185.24; 365/185.33

(58) Field of Classification Search
None
See application file for complete search history.

(56) References Cited

U.S. PATENT DOCUMENTS

| | | | |
|---|---|---|---|
| 5,778,413 A * | 7/1998 | Stevens et al. ............ 711/5 |
| 6,542,430 B2 | 4/2003 | Pochmuller |
| 6,912,638 B2 | 6/2005 | Hellman et al. |
| 7,061,798 B2 * | 6/2006 | Chen et al. ........... 365/185.02 |
| 7,206,224 B1 | 4/2007 | Randolph et al. |
| 7,301,805 B2 * | 11/2007 | Gorobets et al. ........ 365/185.02 |
| 7,522,451 B2 * | 4/2009 | Chen ...................... 365/185.03 |
| 7,577,880 B2 | 8/2009 | Hazama |
| 7,744,387 B2 | 6/2010 | Yu et al. |
| 7,966,462 B2 * | 6/2011 | Lee et al. ................. 711/157 |
| 2006/0155920 A1 * | 7/2006 | Smith et al. ............ 711/103 |
| 2007/0016756 A1 * | 1/2007 | Hsieh et al. ............ 711/216 |
| 2007/0022309 A1 | 1/2007 | Adamo et al. |
| 2007/0168769 A1 * | 7/2007 | Hazama ................. 714/701 |
| 2007/0211530 A1 | 9/2007 | Nakano |
| 2007/0268745 A1 * | 11/2007 | Lasser .................. 365/185.01 |
| 2008/0010400 A1 * | 1/2008 | Moon .................... 711/112 |

(Continued)

FOREIGN PATENT DOCUMENTS

| | | |
|---|---|---|
| JP | 2001-006374 | 1/2001 |
| JP | 2006-059287 | 3/2006 |
| JP | 2008-129771 | 6/2008 |

OTHER PUBLICATIONS

United States Patent and Trademark Office (USPTO), Final Office Action issued in pending U.S. Appl. No. 12/493,349, filed Jun. 29, 2009, with a Notification Date of: Jul. 29, 2013 (14 pgs).

(Continued)

*Primary Examiner* — Sanjiv Shah
*Assistant Examiner* — Marwan Ayash

(57) ABSTRACT

Devices, systems, methods, and other embodiments associated with selectively scheduling memory accesses in parallel are described. In one embodiment, a method determines an access speed for a page request. The access speed is a number of clock cycles used to access a memory device of a group of memory devices. The page request is a request to access a memory page mapped to the memory device. Different page requests are selectively scheduled to access different memory devices in parallel. The different page requests access the different memory devices in a same number of clock cycles.

15 Claims, 11 Drawing Sheets

(56) References Cited

U.S. PATENT DOCUMENTS

| | | |
|---|---|---|
| 2008/0141100 A1 | 6/2008 | Kang et al. |
| 2008/0165579 A1 | 7/2008 | Lee |
| 2008/0215801 A1* | 9/2008 | Tan et al. ............ 711/103 |
| 2008/0316815 A1* | 12/2008 | Lin ............ 365/185.03 |
| 2009/0248952 A1* | 10/2009 | Radke et al. ............ 711/100 |
| 2010/0017561 A1* | 1/2010 | Yang et al. ............ 711/103 |
| 2011/0125954 A1 | 5/2011 | Yeh et al. |
| 2012/0166706 A1 | 6/2012 | Pua et al. |
| 2012/0198131 A1 | 8/2012 | Tan et al. |
| 2012/0272123 A1 | 10/2012 | Yeh |
| 2013/0007340 A1 | 1/2013 | Kim et al. |

OTHER PUBLICATIONS

United States Patent and Trademark Office (USPTO), Non-Final Office Action in pending U.S. Appl. No. 12/493,349, filed Jun. 29, 2009 having a Notification Date of Feb. 22, 2013 (11 pgs).

US Patent and Trademark Office (USPTO) Non-Final Office Action (having a notification date of Feb. 24, 2012) in co-pending U.S. Appl. No. 12/493,349, filed Jun. 29, 2009—9 pgs.

\* cited by examiner

SELECTIVELY SCHEDULING MEMORY ACCESSES IN PARALLEL BASED ON ACCESS SPEEDS OF MEMORY

CROSS REFERENCE TO RELATED APPLICATIONS

This application claims the benefit of U.S. provisional application Ser. No. 61/077,769, filed on Jul. 2, 2008, and is hereby wholly incorporated by reference herein.

BACKGROUND

Digital data is often stored and retrieved from memory. Memory is manufactured in chips of silicon. Semiconductor materials etched onto the silicon allow many transistors to be implemented in a chip to produce high density memories. The transistors may be configured to form NAND gates, inverters, and other functions used to implement the memory.

A memory chip is implemented with many cells. Traditionally, a memory cell stored a single bit of data. A one "1" was stored in the cell when a cell threshold voltage was a first value. A zero "0" was stored in the cell when the cell threshold voltage was a second value. A better way to access memory may be desirable.

SUMMARY

In one embodiment, an apparatus accesses memory devices in parallel. The apparatus may access two memory devices to retrieve data corresponding to two different pages of a block of memory. If the apparatus would automatically take the next two page requests in sequence of page requests, one page request may complete faster than the other page request. In one embodiment, the apparatus prevents this situation by searching for and identifying two pages that will complete in the same amount of memory clock cycles and then controlling the requests to process the identified two pages. Unnecessary idling of the memory devices is reduced or eliminated because both page requests are assured to complete on the same clock cycle(s). Two new page requests can then begin being processed upon the completion of the prior page request without the memory devices becoming idle.

In one embodiment, an apparatus accesses a memory device that has periodic access speeds based, at least in part, on addresses of the memory devices. For example, the memory device includes a multiple level cell (MLC) that stores two or more bits. A multiple level cell has a faster access time for the most significant bits (MSB) than the least significant bits (LSB). For example, the access time to addresses zero and one may be 20 microseconds and the access time to addresses two and three may be 40 microseconds. The access times repeat every four address where the access times to addresses four and five are 20 microseconds and the access times to addresses six and seven are 40 microseconds. Of course, a memory device can have different access times.

The apparatus controls the order of processing page requests by aligning selected page requests. In one embodiment, the apparatus determines which page requests to align by determining which requests will have the same memory device access time based, at least in part, on an arithmetic modulo with a modulus of four. Assume for one example that addresses two and six have an arithmetic modulo of two and addresses three and seven have an arithmetic modulo of three. The arithmetic modulos repeat after every four sequential addresses. Further assume that page requests with an arithmetic modulo of one or two are aligned because addresses with those arithmetic modulos have access times of 20 microseconds. Page requests with an arithmetic modulo of three or four are aligned because addresses with those arithmetic modulos have access times of 40 microseconds. The apparatus selectively schedules page requests to access the memory devices in parallel, based, at least in part, on the modulo results. The aligned page requests access the memory devices in parallel and complete at the same time. Those of ordinary skill in the art will realize the access times of the memory devices may be periodic with a period other than four.

In one embodiment, a method determines an access speed for a page request. The access speed is a number of clock cycles used to access a memory device of a group of memory devices. The page request is a request to access a memory page mapped to the memory device. Different page requests are selectively scheduled to access different memory devices in parallel. The different page requests access the different memory devices in a same number of clock cycles.

Another embodiment includes an apparatus implemented with determination logic and controller logic. The determination logic determines corresponding access speeds a plurality of page requests. The page requests are addressed to two or more memory devices. A multiple level cell (MLC) of the two or more memory devices stores two or more bits. The controller logic selectively schedules page requests from the plurality of page requests to access the two or more memory devices in parallel based, at least in part, on the access speeds.

Another embodiment includes a method. The method receives a plurality of memory requests. Memory requests are selected from the plurality of memory requests. Memory requests selected can be processed by two or more memory devices with similar access speeds. Selected memory requests issued to be processed by the two or more memory devices with similar access speeds are processed in parallel.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
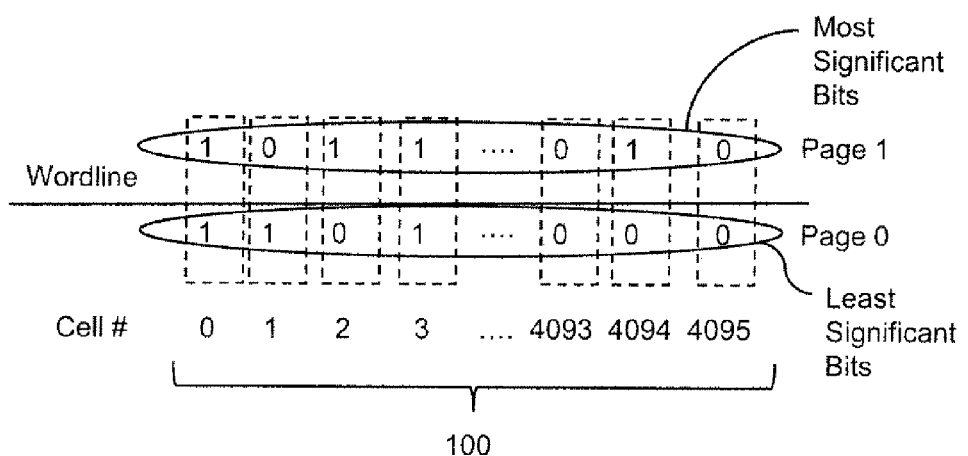
FIG. 1 illustrates one embodiment of a memory map associated with accessing memory.

Described herein are example systems, methods, and other embodiments associated with selectively scheduling memory accesses in parallel. Prior to considering the present systems, methods and embodiments, consider a flash memory designed with a wordline. All the cells connected to the wordline are accessed (e.g., read or programmed) at the same time. In a multiple level cell (MLC), the most significant bits (MSBs) of the cells in the wordline form a first data page and the least significant bits (LSBs) form a second data page. The two data pages will have different access times because the MSBs and the LSBs have different access times. The access time for a particular memory access is variable when there is more than one possible access time. It may be unacceptable in some applications to have a variable memory access time.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware, firmware, software stored or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Memory access", as used herein, includes but is not limited to writing, reading, content addressable memory (CAM) matching, and programming a memory cell or a group of memory locations. Memory access may include dual reads to the same memory using two read ports. Memory access includes other types of interactions with memory as would be appreciated by those of ordinary skill in the art.

FIG. 1 illustrates one embodiment of a memory map 100 associated with selectively scheduling memory accesses in parallel. In one embodiment, the memory map 100 is for a memory device that includes multiple level memory cell devices (MLMCDs). In one embodiment, a MLMCD is a flash memory. FIG. 1 shows an example MLMCD containing a group of memory cells (cell numbers 0 to 4095) where each cell has a most significant bit (MSB) and a least significant bit (LSB). Groups of LSBs of different MLMCDs are combined to form a wordline corresponding to a first page (page 0) of memory. The MSBs are combined to form a wordline corresponding to a second page (page 1) of memory. In one example, an MLMCD stores both the LSB and the MSB as a charge level in the floating gate of a transistor. In one embodiment, the charge level is reflected through a threshold voltage of a floating gate transistor. The threshold voltage is programmed, for example, by injecting electrons onto the floating gate.

Figure 2:
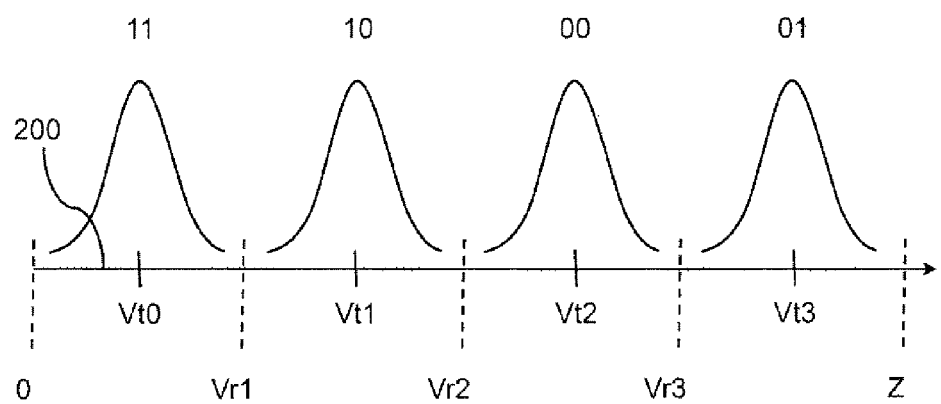
FIG. 2 illustrates an embodiment of memory voltages associated with selectively accessing memory using requests scheduled in parallel.

Reading the LSB may take longer than reading the MSB. FIG. 2 shows a range of values that a two bit MLC threshold voltage 200 may represent When reading the LSB or the MSB, a first voltage comparison is made to determine if the threshold voltage 200 is above or below a medium voltage threshold. The MSB is high when the threshold voltage 200 is below Vr2, otherwise the MSB is low. The MSB is known after the first comparison. However, additional comparisons are performed to determine the LSB. The additional comparisons cause the access time of the LSB to be longer. The LSB is low when a second voltage comparison between the threshold voltage 200 and a second voltage threshold, Vr1, determines that the threshold voltage is above the second voltage threshold, Vr1, and a third comparison between the threshold voltage 200 and a third voltage threshold, Vr3, determines that the threshold voltage is below the third voltage threshold, Vr3. The LSB is high when the second voltage comparison determines that the threshold voltage is below the second voltage threshold, Vr1, or above the third threshold voltage, Vr3. The access time of the LSBs page 0 of FIG. 1 will be longer than the access time of page 1.

Figure 3:
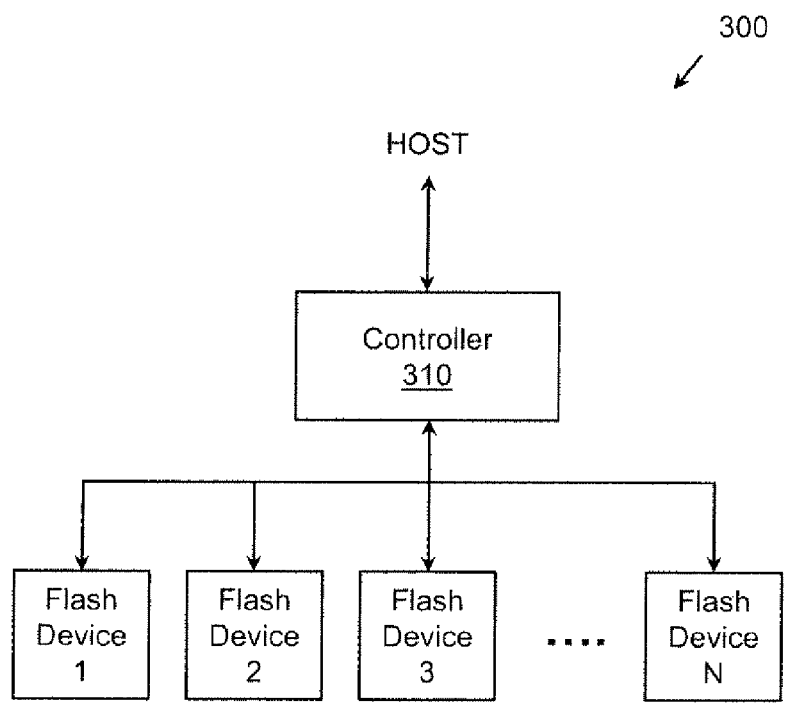
FIG. 3 illustrates an embodiment of a memory system associated with selectively accessing memory using requests scheduled in parallel.

FIG. 3 illustrates one embodiment of a system 300 associated with accessing memory. The system 300 comprises a controller 310 for scheduling page requests to flash devices 1-N. The flash devices 1-N will complete the page accesses before the controller 310 issues a new page request to the flash devices 1-N. If the requests are processed in order, the controller 310 will need to wait until the slowest memory access has completed before issuing a new page request to another flash device 1-N that may be idle. As will be described in more detail below, the controller 310 aligns page requests with similar memory access times and then process the aligned requests in parallel. In this manner, the system 300 can access memory more efficiently.

Figure 4:
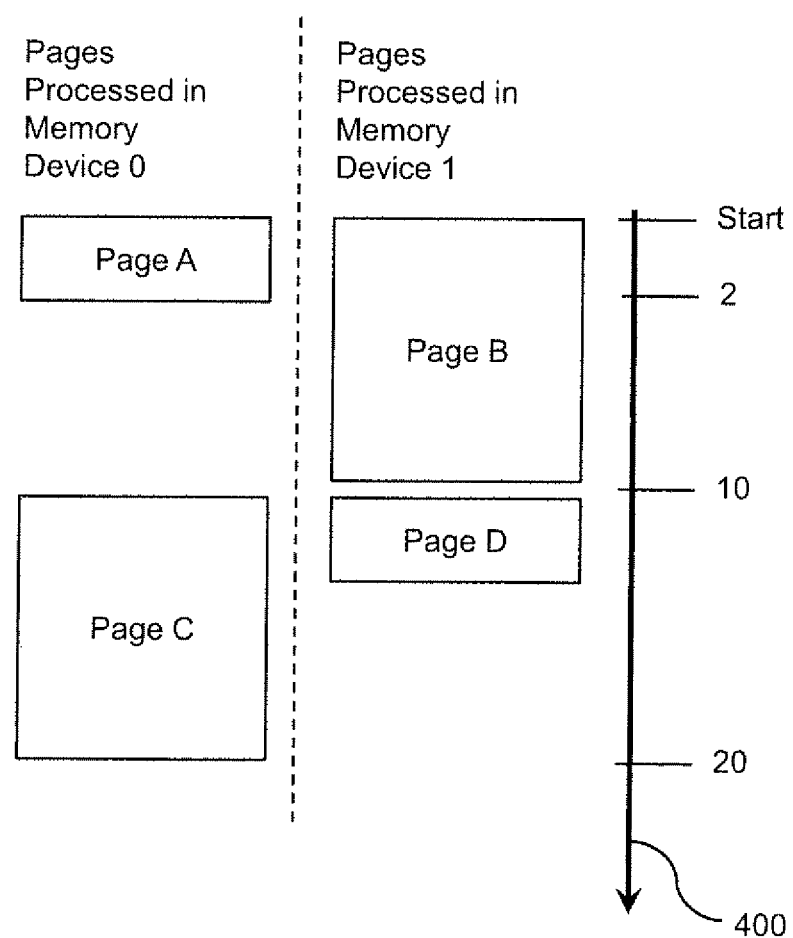
FIG. 4 illustrates an example of memory accesses with unaligned requests.

FIG. 4 illustrates an effect of processing page requests in a first-in-first-out order that may cause idle time between page requests. In the example, memory accesses for pages A, B, C and D have different access times. For this example, there are two memory devices. Initially, page A and page B are scheduled by a controller for execution. A time line 400 is illustrated as a reference guide to show when page requests begin and when page requests are completed. Page A is a fast access and completes in two time units. Page B is a slow access and completes in 10 time units. Memory device 0 must wait until page B is completed (e.g. from time unit 2 until time unit 10 on the time line 400) even though memory device 0 processed the access to page A by time unit 2. Page C and page D are scheduled to access the memory devices and begin execution at time unit 10 and the access to page C is completed at time unit 20.

Figure 5:
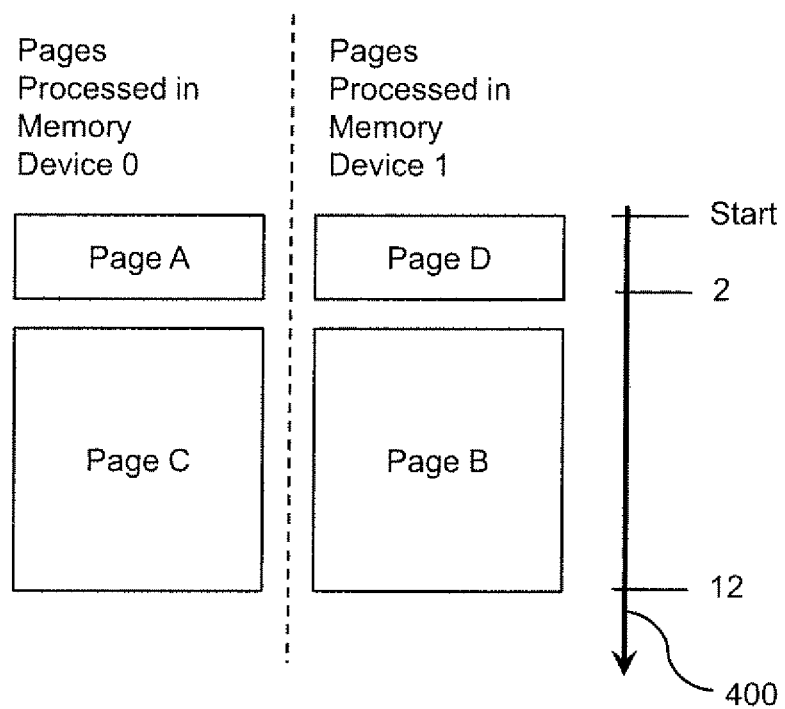
FIG. 5 illustrates one embodiment of memory accesses with aligned requests.

FIG. 5 illustrates one example of how the controller 310 (FIG. 3) controls and schedules memory accesses by aligning selected page requests from FIG. 4. In FIG. 5, pages A and D have the same (or similar) access time and thus are aligned and scheduled for parallel execution at the same start time. The access to pages A and D are completed at about time unit 2. Accordingly, both memory device 0 and memory device 1 complete the page requests at or near the same time and are ready for the next request. Thus idle time is reduced. Pages B and C are then scheduled for execution at time unit 2. The four page accesses are completed at time unit 12 as compared to the completion time at time unit 20 shown in FIG. 4. Because the pages are aligned based on having similar characteristics, idle time between memory devices was reduced.

Figure 6:
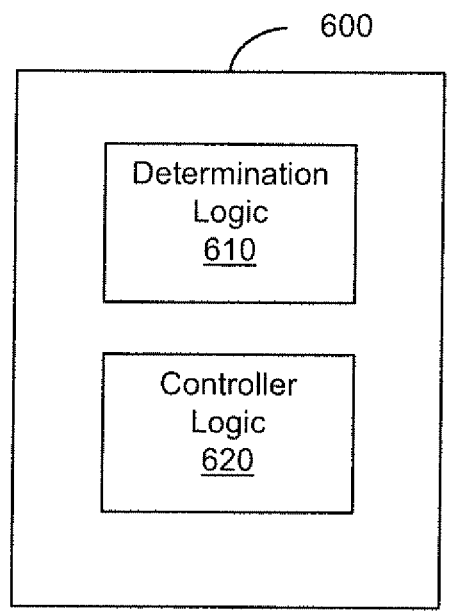
FIG. 6 illustrates an embodiment of an apparatus associated with selectively scheduling memory accesses in parallel.

FIG. 6 illustrates one embodiment of an apparatus 600 associated with controlling and selectively scheduling memory accesses in parallel. The apparatus 600 comprises determination logic 610 that determines an arithmetic modulo of the address of a requested page access. The page requests are requests to access multiple level memory cell devices (MLMCDs). Two or more MLMCDs are accessed in parallel to process the page requests. In one example, the MLMCDs store two or more bits in multiple level cells (MLCs) (see FIG. 1). As previously described, a first page of data is formed by (or corresponds to) the group of most significant bits (MSBs) of the MLCs and a second page is formed by (or corresponds to) the group of least significant bits (LSBs) of the MLCs (see FIG. 1). In the example, MLCs of the MLMCDs are grouped as in FIG. 1 to form wordlines of different pages.

The apparatus 600 comprises controller logic 620 that selectively schedules page requests to access the MLMCDs in parallel. The page requests are scheduled based, at least in part, on corresponding arithmetic modulos that are determined from the page requests. For example, the determination logic 610 calculates a modulo for a page request. In one embodiment, the modulo is calculated from an address that the page request is to access. Other modulos are calculated for other page requests. The modulo values for each page request are stored. Modulo values of page requests are a characteristic used to predict how much time is needed for a page request to access a memory. For example, page requests that have the same modulo are assumed to use the same amount of time to access the MLMCDs. The controller logic 620 identifies page requests with the same or similar modulo value and schedules two or more of the identified page requests to be processed in parallel. This is also referred to as aligning page requests for parallel processing. Based on the disclosure and teachings provided herein, a person of ordinary skill in the art will understand how to determine similar or other modulo values.

Using the example page requests from FIG. 5, the controller logic 620 identifies which page requests have the same or similar access time. The controller logic 620 may identify page requests that access addresses that have a same or similar modulo result. Page requests with the same or similar modulo result likely have a same or similar memory access time. For example pages A and D as shown in FIG. 4 are processed in about the same time, which is less time than that of pages B and C. Calculating the modulo of page A (using the memory address it will access) will likely have the same or a similar modulo determined from page D (using its memory address). The modulo calculated from page B will be different from pages A and D, but will be the same as or similar to the modulo of page C. The controller logic 620 re-orders the scheduling so that pages A and D (fast pages) are executed in parallel. In this example, slower than pages C and B are scheduled for execution together since they have similar access times. Scheduling pages with the same or similar access time together prevents one memory device from going idle for an extended time when a slow and a fast memory access request are scheduled together. This will also reduce the idle time between the next two pages being processed in parallel.

In another embodiment, the apparatus 600 may receive a request to program data into two or more memory devices. The determination logic 610 determines memory pages to be programmed that have similar access times for programming new data. The request may be a request to program data without specifying addresses to be programmed. In this case, the determination logic 610 determines memory devices that have similar access times to be programmed in parallel. The controller logic 620 will program memory devices based on the determinations of the determination logic 610. As understood by those of ordinary skill in the art, the apparatus 600 may align other memory accesses in addition to reading and programming accesses.

In one embodiment, two or more bits stored in the MLC have different access rates based, at least in part, on an MLC access type. For example, the access rate of a page read may be faster than the access rate for programming a page. In one embodiment, the controller logic 620 selectively schedules the page requests based, at least in part, on the different access rates. The page requests may be scheduled based on the different access rates in addition to modulo values of page requests as discussed above. The MLC access type may be one of reading, content addressable memory (CAM) matching, and/or programming a location in an MLMCD. Programming is the storing of a new value to a MLC cell in the flash memory and is similar to the traditional writing of a memory cell.

TABLE 1

| Page | 0 | 1 | 2 | 3 | 4 | 5 | 6 | 7 | ... |
|---|---|---|---|---|---|---|---|---|---|
| Program Time | 200 us | 200 us | 800 us | 800 us | 200 us | 200 us | 800 us | 800 us | |
| Read Time | 20 us | 20 us | 40 us | 40 us | 20 us | 20 us | 40 us | 40 us | |

Table 1 shows the access times for one example flash memory. The flash memory has been implemented so that two fast page addresses are followed by two slow page addresses that are followed by two fast page addresses and so on. This pattern repeats because the most significant bits (MSBs) of the flash memory implement two pages corresponding to two addresses. Furthermore, the least significant bits (LSBs) of the flash memory implement two pages corresponding to the next two addresses and so on. This pattern repeats with increasing page numbers with two fast pages followed by two slow pages and then two fast pages and so on. As discussed above, the MSBs of the fast pages are accessed faster (e.g. processed in less time) than the LSBs of the slow pages. The architecture and the banking of the flash memory results in the fast access pages occurring in groups of two followed by the slow access pages occurring in groups of two and so on.

In this example, the period of the addresses is four because the access times repeat every four pages. The program time for pages 0 and 1 is 200 microseconds and for pages 2 and 3 the program time is 800 microseconds. This pattern of program times repeats every four pages with a period of four. The read time for pages 0 and 1 is 20 microseconds and for pages 2 and 3 the read time is 40 microseconds. This pattern of read times also repeats every four pages with a period of four. Of course, the illustrated values may change depending on a particular implementation of memory and the device that uses the memory.

A modulus for the page addresses shown in Table 1 is chosen as four because the access times of Table 1 repeat with a period of four. A modulus is a value used in modulo arithmetic to calculate the modulo of a parameter (e.g., a page of memory). The modulos of the pages of Table 1 will repeat when the modulus is four. In one embodiment using the example values, determination logic 610 calculates the modulo of page 0 to be zero. The modulo of pages 1-3 will be 1, 2, and 3, respectively. The determination logic 610 will calculate the modulo of page 4 to be 0 and the modulo of pages 5-7 to be 1, 2, and 3, respectively. The modulo of the pages repeats similar to how the access times of Table 1 repeat. Of course, the modulus may change depending on the implementation of the memory. The controller logic 620 may use the modulos of the pages to schedule pages requests to be executed in parallel as discussed.

In one embodiment, the determination logic 610 may have a modulus of four programmed into the determination logic 610 based on prior knowledge of how the flash memory of Table 1 was architected. In another embodiment, the determination logic 610 determines a modulus of a string of addresses. For example, the determination logic 610 may monitor a history of access times and corresponding page request addresses. The determination logic 610 detects a modulus if address access times begin repeating a pattern for a sequential string of page addresses. The modulus may be detected by comparing access times to pages addresses and recognizing a periodic pattern.

In another embodiment, a period of the program times and a period of the read times are different. When the program and read times have different periods, the controller logic 620 schedules memory accesses to access the MLMCDs in parallel so that the page accesses complete at nearly the same time. Those of ordinary skill in the art will understand that the memory devices may have periods based, at least in part, on addresses other than a period of four.

In another embodiment, suppose that the address of a page has a different period for different address ranges. For example, addresses in the range of addresses 0 to 4000 may have a period of four and addresses in the range of addresses 4000 to 20,000 may have a period of eight. The controller logic 620 controls scheduling of memory accesses by aligning memory accesses to execute in parallel based, at least in part, on the memory range that the memory accesses are to access. Thus the aligned memory accesses may be optimized to complete at a similar time thereby reducing idle time.

With reference to FIG. 6, in one embodiment, the access times of the MLMCDs are periodic based, at least in part, on the addresses of the MLMCDs. The determination logic 610 determines a modulus to be a period based, at least in part, on the addresses of the MLMCDs. The arithmetic modulo is based, at least in part, on the modulus. For example, when the period is six, the modulus is six. In this example, memory addresses with an arithmetic modulo of 0, 1, 2 and 3 have the same or similar memory access time and memory addresses with an arithmetic modulo of 4 and 5 have a same or similar memory access time.

In one embodiment, the controller logic 620 aligns memory requests by implementing functions using the following pseudo-code algorithm or similar algorithm (comments are designated by "//"):

Compute r1=arithmetic modulo(k1, 4) and r2=arithmetic modulo(k2,4)
    //r1 is the arithmetic modulo result of k1, where the modulus is 4 and //k1 is the address of a page of memory
    //r2 is the arithmetic modulo result of k2, where the modulus is 4 and
    //k2 is the address of a page of memory
    //modulus=4 and is constant for this pseudo-code algorithm
    while r1!=r2//determine if r1 does not equal r2
        k2=k2+1//increment to the next page and update k2
        r2=modulo(k2,4)//r2 is the new arithmetic modulo of next page k2, //where the modulus is 4.
    end while The controller logic 620 implementing this pseudo-code would check the modulo of a first page of memory, k1, and a second page of memory, k2. If the modulos are not the same, the page address of k2 is incremented and the modulo of the incremented page is compared to the modulo of the first page of memory, k1. This process continues in the "while loop" until a page of an incremented page, k2, is found that matches the first page, k1. The modulo of incremented page, k2, now equals the modulo of the first page, k1. The controller logic 620 may now schedule the incremented page, k2, and the first page, k1, to be executed in parallel. The two pages with the same modulo are likely to have the same memory access time for the reasons discussed above.

In one embodiment, the apparatus 600 accesses MLC NAND flash memory devices. The apparatus 600 alternatively accesses an MLC flash memory in a bank of memory. In another embodiment, the apparatus 600 is located in a chip. A chip is a set of micro-miniaturized electronic circuits fabricated on a piece of semiconductor material.

Figure 7:
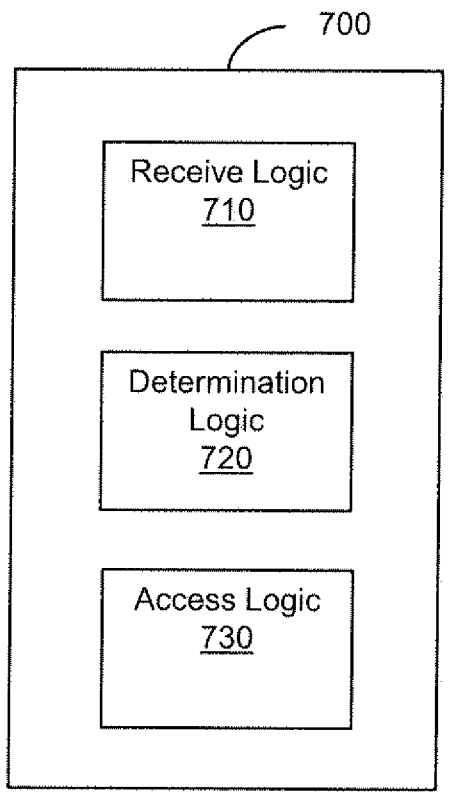
FIG. 7 illustrates another embodiment of an apparatus associated with selectively scheduling memory accesses in parallel.

FIG. 7 illustrates another embodiment of an apparatus 700 for selectively scheduling memory accesses in parallel. The apparatus 700 comprises receive logic 710 that receives memory requests to a bank of memory. The bank of memory is accessible in different numbers of clock cycles. The different number of clock cycles depends, at least in part, on address ranges and access types of the block of memory.

The apparatus 700 comprises determination logic 720 that determines a first memory access. The first memory access comprises aligned memory requests. The aligned memory requests are processed by the apparatus 700 in a same number of clock cycles. In one embodiment, the determination logic 720 determines a first memory access based, at least in part, on either a hash function or a table lookup. For example, the hash function may be a one-to-one mapping function that maps page addresses to a number of clock cycles needed to complete a memory access to the addresses on a per address basis.

The apparatus 700 comprises access logic 730 for accessing the bank of memory with the first memory access. In one embodiment, the access logic 730 comprises routing logic to route the first memory request to the bank of memory.

In another embodiment, the apparatus 700 may include calculation logic to perform an arithmetic modulo calculation of an address of the first memory request. The arithmetic modulo result indicates which addresses have a similar access time. For example, addresses with an arithmetic modulo result of 0 and 1 may have a fast access time and addresses with an arithmetic modulo result of 2 and 3 may have a slow access time. For example addresses of 0, 1, 4, 5, 8, 9 and so on have an arithmetic modulo of either 0 or 1 and address of 2, 3, 6, 7, 10, 11 and so on have an arithmetic modulo of either 2 or 3. The first memory access is based, at least in part, on the arithmetic modulo calculation. As discussed above, the access times may also depend on the type of memory operation. For example, a programming memory operation may have a slower access time than a read memory operation for the same address.

In one embodiment, the calculation logic performs an arithmetic modulo calculation based, at least in part, on a period of the addresses of a bank of memory. The access times of the bank of memory may be periodic as discussed above. The period is based, at least in part, on addresses of the bank of memory. The calculation logic performs an arithmetic modulo calculation with a modulus based, at least in part, on the period.

In one embodiment, the determination logic 720 determines a second memory access. The second memory access comprises two or more aligned memory requests. The second memory access is processed in a second number of clock cycles. The second memory access is processed in a different number of clock cycles than the first memory access.

In one embodiment, the calculation logic performs an arithmetic modulo calculation based, at least in part, on a programmable modulus. For example, a register may store the modulus. The register may be written with a different value to change the modulus. The memory access is based, at least in part, on the arithmetic modulo calculation as described above. The access times of the bank of memory are periodic based, at least in part, on addresses of the bank of memory.

Figure 8:
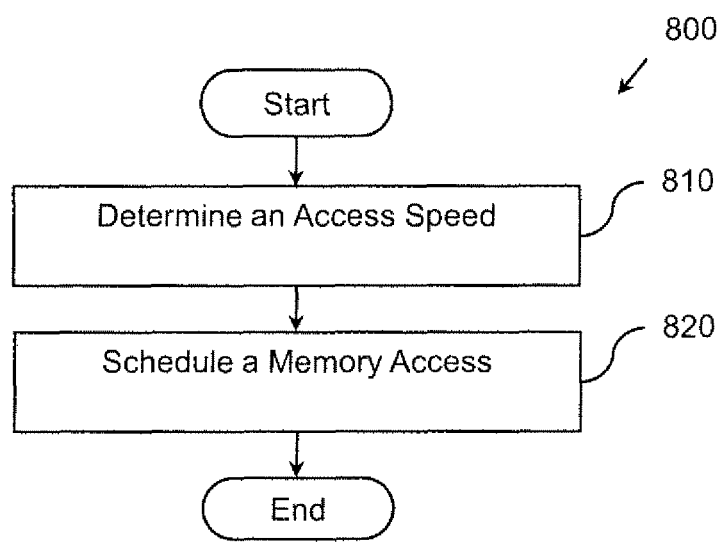
FIG. 8 illustrates one embodiment of a method associated with selectively scheduling memory accesses in parallel.

FIG. 8 illustrates an embodiment of method 800 associated with selectively scheduling memory accesses in parallel. The method 800 may include at least some of the operations that apparatuses 600 and 700 (FIGS. 6 and 7) are to perform. The method 800 improves the accessing of memory by aligning memory requests with the same or similar memory access times to be processed in parallel. The method 800, at 810, determines an access speed for a page request. In one embodiment, the access speed is a number of clock cycles used to access a memory device. A page request is a request to access a memory page mapped to memory devices.

The method 800 selectively schedules, at 820, page requests to access the memory devices in parallel, Page requests that have the same or similar characteristic as described above (e.g. use the same/similar access time, have the same modulo) are identified. In one example, the identified page requests access the memory devices in a same number of clock cycles. In one embodiment, the selective scheduling aligns the identified page requests so that the page requests are executed in parallel. The page requests that are aligned may be stored in a memory controller. The memory controller will issue the page requests at an appropriated time for execution. The page requests are executed to access corresponding pages of memory. Individual page requests may access one page of memory.

In one embodiment, the page requests access a sequential string of memory pages. The page requests access one page on a page request basis. In one embodiment, the method 800 comprises determining a period. The period is based, at least in part, on access speeds of the sequential string of memory pages as discussed above for apparatus 600 and apparatus 700. The page requests are scheduled based, at least in part, on the period. The arithmetic modulo is based, at least in part, on the period. Selectively scheduling the page requests is based, at least in part, on an arithmetic modulo as previously described.

In one embodiment, the method 800 comprises determining arithmetic modulo results for the page requests using the addresses from the page requests. The modulo can be determined for some or all the page requests. The arithmetic modulo result is based, at least in part, on a modulus. The modulus is based, at least in part, on the access speeds of the sequential string of memory pages. Selectively scheduling page requests is based, at least in part, on the arithmetic modulo results.

In one embodiment, the page requests are periodic with respect to addresses of the memory devices. Initial addresses of the pages requests may be part of an incomplete period of addresses. An example of page(s) associated with an incomplete period is discussed in the next paragraph. The method 800 comprises scheduling the initial page requests to access the memory devices in parallel. Other page requests are scheduled to access the memory devices in parallel upon the completion of the initial page requests.

In one embodiment, the period is four and pages 3-11 are the pages requested by the page requests. Pages 0, 1 and 2 are not accessed. In this example, pages 3, 6, 7, 10, and 11 are slow access pages. Pages 4, 5, 8, and 9 are fast access pages. Pages 4-11 are processed after the request for page 3 is completed. Page 3 is part of an incomplete period of pages. This allows fast pages 4 and 5 to be aligned and scheduled in parallel, slow pages 6 and 7 to be aligned and scheduled in parallel, and so on.

In one embodiment, the method 800 comprises scheduling page requests that have a first access speed to be executed in parallel. In this embodiment, the method 800 also comprises scheduling page requests that have a second access speed to be executed in parallel. Page requests that have the first access speed are processed with a first process speed below a first tolerance level. Page requests that have the second access speed are processed with a second process speed below a second tolerance level.

In one embodiment, the method 800 controls accessing multiple level cell (MLC) flash memory devices. In another embodiment, the method 800 is implemented in a chip. A chip is a set of micro-miniaturized electronic circuits fabricated on a piece of semiconductor material.

Figure 9:
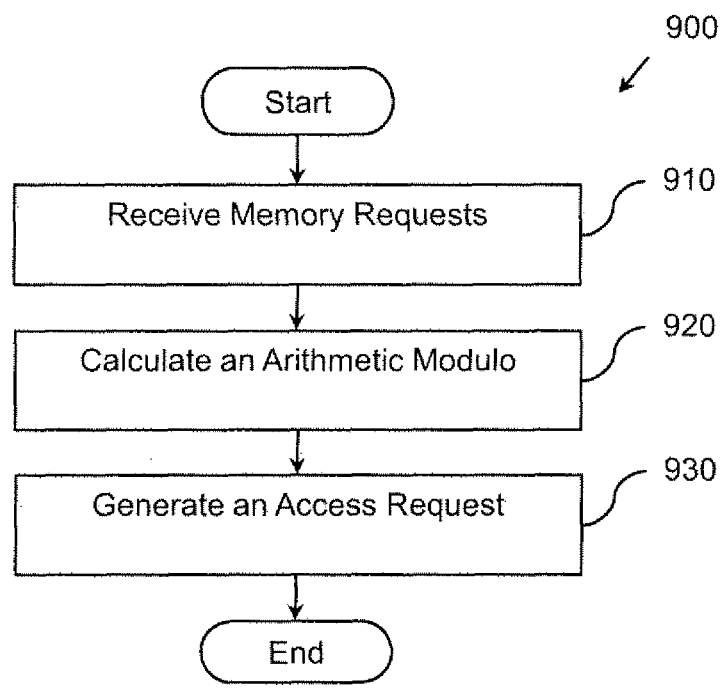
FIG. 9 illustrates another embodiment of a method associated with selectively scheduling memory accesses in parallel.

FIG. 9 illustrates an example method 900 associated with accessing memory. The method 900 may include some of the operations that apparatus 600 and 700 (FIGS. 6 and 7) are to perform. The method 900 improves the accessing of memory by scheduling memory requests with the same or similar access times in parallel. Memory requests can be a byte of memory, words of memory, pages of memory or other sizes of memory. A page of memory is generally a block of memory of a fixed size. For example, a page of memory may be 1024 (1K) bytes in size. Scheduling memory requests with the same or similar access times in parallel reduces memory idle time. The method 900 comprises receiving, at 910, memory requests. The memory requests are directed to a bank of memory. The bank of memory is accessible at different access speeds. The access speeds correspond to ranges of addresses. In one embodiment, different access speeds are periodic based, at least in part, on addresses of the bank of memory.

The method 900 calculates, at 920, on a memory request basis, an arithmetic modulo. The arithmetic modulo is based, at least in part, on an address of the memory request. In one embodiment, the arithmetic modulo may be calculated based, at least in part, on the period of the addresses of the bank of memory.

The method 900 comprises generating an access request, at 930, to access the bank of memory. The access request comprises aligned memory requests. The aligned memory requests have the same or similar arithmetic modulo. The aligned memory requests access different banks of the bank of memory. The different banks of the bank of memory are accessible within a tolerance of a same speed. The aligned memory requests access the bank of memory in parallel.

In one embodiment, the method 900 comprises determining a modulus for the memory requests. The modulus is based, at least in part, on addresses of the bank of memory and is calculated as discussed above. The arithmetic modulo is calculated with the modulus. Generating the access request generates one or more requests to access different pages of memory in parallel based, at least in part, on the arithmetic modulo.

In one embodiment, generating an access request comprises skipping a memory request. The skipped memory request has a first access speed different than the access speed of a current memory request. In one embodiment, the method 900 comprises marking the skipped memory request. A subsequent access request is generated with the skipped memory request.

Figure 10:
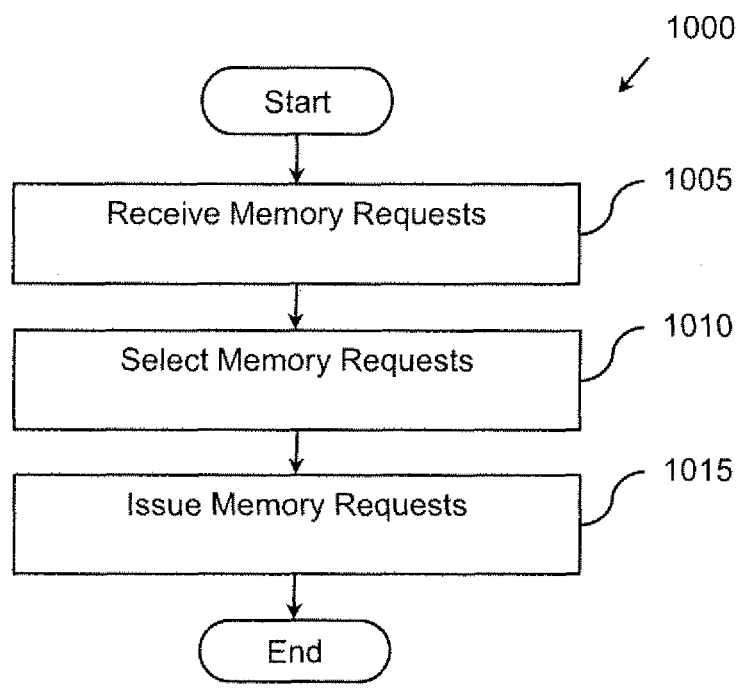
FIG. 10 illustrates another embodiment of a method associated with selectively scheduling memory accesses in parallel.

FIG. 10 illustrates an example method 1000 associated with accessing memory. The method 1000 may include some of the operations performed by apparatus 600 and/or 700 (FIGS. 6 and 7). The method may improve the accessing of memory by determining if memory devices are capable of processing memory requests in parallel and scheduling memory requests to devices that are capable of processing memory requests in parallel.

In one embodiment, a group of memory access requests is received, at 1005. The memory access requests may be requests to read or program memory. The memory access requests may be requests that do not contain access addresses.

Next, memory access requests are selected, at 1010, from the received memory access requests. The memory access requests are selected so that selected requests can be processed by two or more memory devices with similar access speeds. The method 1000 may determine if a memory device can process a memory request in a certain time period. A memory access will be selected for the memory device if the memory device can process the memory access in the time period.

In another embodiment, an access speed tolerance is determined. The memory requests can be selected based on the access speed tolerance. Subsequently, memory requests are issued to memory devices that can process the memory requests in the access speed tolerance.

The selected memory requests are issued to memory devices, at 1015. The selections create a grouping of memory requests that in a sense control the order of execution. The memory devices will execute the issued memory requests with similar processing times in parallel. In another embodiment, memory requests are issued to memory devices with similar access speeds in parallel.

It will be appreciated that in one embodiment, the methods herein may be implemented as computer executable instructions embodied and stored on a computer-readable medium. When executed by a machine (e.g., processor, device) the instructions cause the machine to perform the methods herein and their equivalents. The methods can also be implemented with circuits.

Figure 11:
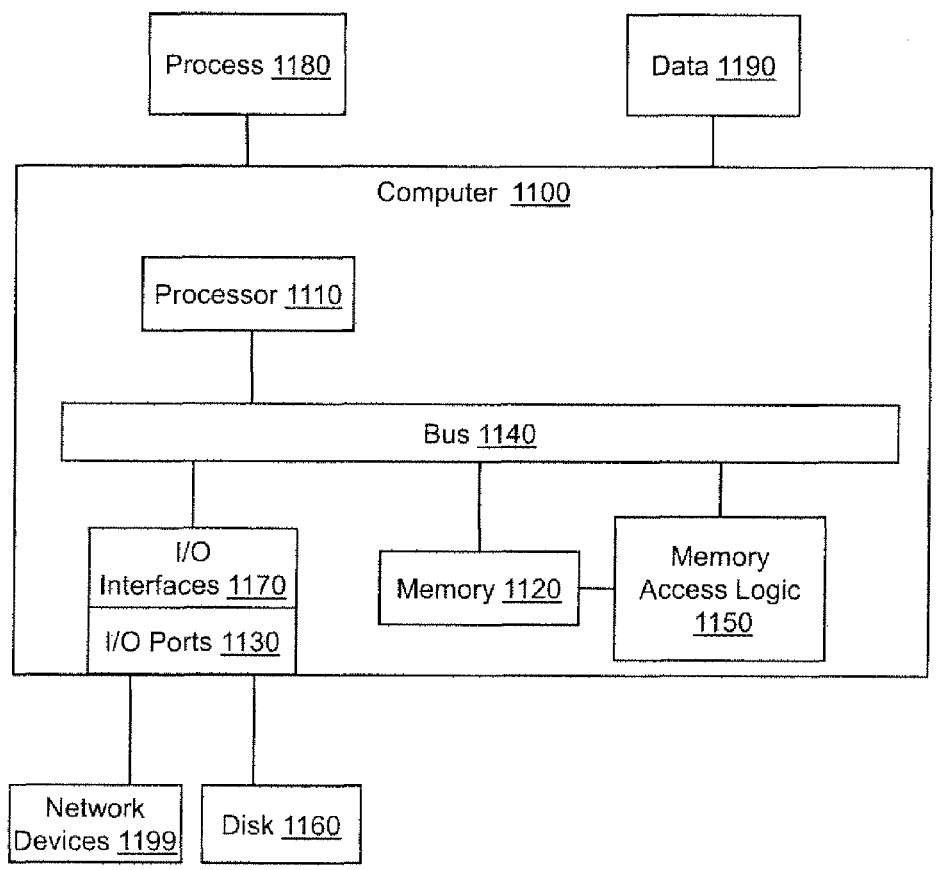
FIG. 11 illustrates an embodiment of a computing environment in which example systems and methods, and equivalents associated with selectively scheduling memory accesses in parallel.

FIG. 11 illustrates an example computing device in which example systems and methods described herein, and equivalents, may be implemented. In one embodiment, the computing device is a computer 1100 that includes a processor 1110, a memory 1120, and input/output ports 1130 operably connected by a bus 1140. In one example, the computer 1100 includes a memory access logic 1150 to access memory.

The memory access logic 1150 provides means (e.g., hardware, stored software, firmware) for selectively scheduling memory accesses in parallel. The memory access logic 1150 can be implemented similar to the apparatus 600 and 700, and/or combinations of their features. The memory access logic 1150 can include logic implemented, for example, as an ASIC or other type of circuit.

Generally describing an example configuration of the computer 1100, the processor 1110 may be a variety of various processors including dual microprocessor and other multi-processor architectures. A memory 1120 may include volatile memory and/or non-volatile memory. Non-volatile memory may include, for example, read-only memory (ROM), programmable read only memory (PROM), erasable programmable read only memory (EPROM), electronically erasable programmable read only memory (EEPROM), and so on. Volatile memory may include, for example, random access memory (RAM), static random access memory (SRAM), dynamic random access memory (DRAM), and so on.

A disk 1160 may be operably connected to the computer 1100 via, for example, through an input/output interface (e.g., card, device) 1170 and the input/output port 1130. The disk 1160 may be, for example, a magnetic disk drive, a solid state disk drive, a floppy disk drive, a tape drive, a Zip drive, a flash memory card, a memory stick, and so on. Furthermore, the disk 1160 may be a compact disk read-only memory (CD-ROM) drive, a compact disk recordable (CD-R) drive, a compact disk rewritable (CD-RW) drive, a digital video disk read-only memory (DVD ROM), and so on. The memory 1120 can store a process 1180 and/or a data 1190, for example. The disk 1160 and/or the memory 1120 can store an operating system that controls and allocates resources of the computer 1100.

The bus 1140 may be a single internal bus interconnect architecture and/or other bus or mesh architectures. While a single bus is illustrated, it is to be appreciated that the computer 1100 may communicate with various devices, logics, and peripherals using other busses (e.g., peripheral component interconnect express (PCIE), 1394, universal serial bus (USB), Ethernet). The bus 1140 can be types including, for example, a memory bus, a memory controller, a peripheral bus, an external bus, a crossbar switch, and/or a local bus.

The computer 1100 may interact with input/output devices via the input/output (I/O) interfaces 1170 including the memory access logic 1150 and the input/output ports 1130. Input/output devices may be, for example, a keyboard, a microphone, a pointing and selection device, cameras, video cards, displays, the disk 1160, the network devices 1199, and so on. The input/output ports 1130 may include, for example, serial ports, parallel ports, and USB ports.

The computer 1100 can operate in a network environment and thus may be connected to the network devices 1199 via the I/O interfaces 1170, and/or the I/O ports 1130. Through the network devices 1199, the computer 1100 may interact with a network. Through the network, the computer 1100 may be logically connected to remote computers. Networks with which the computer 1100 may interact include, but are not limited to, a local area network (LAN), a wide local area network (WLAN), a wide area network (WAN), and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A method, comprising:
   determining an arithmetic modulo result associated with an address of a page request and at least one other page request on a per page request basis, wherein the arithmetic modulo result is based, at least in part, on a modulus;
   determining, by a hardware controller, an access speed for the page request to a memory device with memory cells that are multiple level cells that have a same bit density, wherein the access speed is a number of clock cycles used to access a memory page associated with the page request in the memory device, wherein the page request is a request to access the memory page mapped to the memory device, wherein the page request and the at least one other page request are requesting to access a sequential string of memory pages and are requesting to access single pages on a per page request basis, wherein the modulus is based, at least in part, on access speeds of the sequential string of memory pages, and wherein the multiple level cells include a first set of memory pages that are accessed according to a first access speed and a second set of memory pages that are accessed according to a second access speed that is different from the first access speed; and
   scheduling the page request based, at least in part, on the access speed, wherein scheduling the page request includes assigning the page request to be serviced in parallel with the at least one other page request that is to access a different memory page in the memory device in a same number of clock cycles, wherein scheduling the page request includes aligning the page request and the at least one other page request, and controlling the page request and the at least one other page request to be executed in parallel, and wherein scheduling the page request and the at least one other page request is based, at least in part, on the arithmetic modulo result.

2. The method of claim 1, further comprising determining a period, wherein the period is based, at least in part, on access speeds of the sequential string of memory pages, and wherein scheduling the page request and the at least one other page request is based, at least in part, on the period.

3. The method of claim 1, wherein the determining an access speed for the page request comprises looking up the access speed in a lookup table based, at least in part, on a hash function.

4. The method of claim 1, wherein the page request and the at least one other page request are periodic with respect to addresses of the memory device, wherein one or more initial page requests of the page request and the at least one other page request are part of an incomplete period; and
   wherein the method comprises scheduling the one or more initial page requests to access the memory device before scheduling other page requests of the page request and the at least one other page request to access the memory device.

5. The method of claim 1, wherein the memory device is a multiple level cell (MLC) flash memory device, and wherein the first set of memory pages are most significant bits of the memory cells and the second set of memory pages are the least significant bits of the memory cells.

6. The method of claim 1, wherein scheduling the page request and the at least one other page request includes scheduling reading of a page of memory or the programming of a page of memory, wherein the page request and the at least one other page request are requests to different memory pages of the memory device of a same order bit, and wherein first set of memory pages correlate to most significant bits of the memory cells and the second set of memory pages correlate to the least significant bits of the memory cells.

7. An apparatus, comprising:
   determination logic implemented in hardware and configured to determine arithmetic modulo results associated with addresses of a plurality of page requests on a per page request basis, wherein each of the arithmetic modulo result is based, at least in part, on a modulus, wherein the determination logic is configured to use the arithmetic modulo results to determine corresponding access speeds of the plurality of page requests, wherein the access speeds are a number of clock cycles to access memory pages associated with the plurality of page requests,
   wherein the plurality of page requests are addressed to the memory pages in a memory device that is comprised of multiple level memory cells with a same bit density, and wherein the multiple level cells store two or more bits, wherein the plurality of page requests are requests to the memory pages of the memory device, wherein the modulus is based, at least in part, on access speeds of the memory pages, wherein at least two of the plurality of page requests are requesting access to a sequential string of memory pages on a per page request basis,
   wherein the memory pages include a first set of memory pages that are accessed according to a first access speed and a second set of memory pages that are accessed according to a second access speed that is different from the first access speed; and
   controller logic configured to schedule two or more page requests from the plurality of page requests to access the memory pages in parallel when memory pages associated with the two or more page requests have a same access speed, wherein the controller logic is configured to schedule the two or more page requests to be serviced in parallel in a same number of clock cycles by aligning the two or more page requests to be executed in parallel.

8. The apparatus of claim 7, wherein the determination logic is configured to lookup the access speeds in one or more lookup tables.

9. The apparatus of claim 7, wherein the determination logic is configured to apply a hash function to determine the access speeds.

10. The apparatus of claim 7, wherein the determination logic is configured to determine corresponding access speeds of the plurality of page requests by determining the arithmetic modulo result using the modulus that is an integer number of bits represented by multiple level cell (MLC) in the memory device.

11. The apparatus of claim 7, wherein the plurality of page requests are requests to read from the memory device, to content addressable memory (CAM) match, or to program a location in the memory device.

12. The apparatus of claim 7, wherein the controller logic is configured to schedule the two or more page requests to be executed in parallel when the memory pages associated with the two or more page requests have a same access speed, and wherein the two or more page requests are requests to access multiple level cell (MLC) memories of the memory device.

13. The apparatus of claim 7, wherein the memory device is a multiple level memory cell device comprising flash memory, wherein the plurality of page requests include requests to access a first set of memory pages that correspond with groups of most significant bits of memory cells in the memory device and to access a second set of memory pages that correspond with least significant bits of memory cells in the memory device, and wherein the first set of pages and the second set of pages have different access speeds.

14. A method, comprising:
receiving, in a hardware controller, a plurality of memory requests;
determining an arithmetic modulo result for each of the plurality of memory requests, wherein the arithmetic modulo result is based, at least in part, on an address of each of the plurality of memory requests and a modulus;
determining access speeds for the plurality of page requests, wherein an access speed for each of the plurality of page requests is a number of clock cycles to access a memory page associated with each of the plurality of page requests;
selecting memory requests from the plurality of memory requests that are to be processed by a memory device comprised of multiple level memory cells with a same bit density, wherein the plurality of page requests are requests to access memory pages mapped to the memory device, wherein the multiple level cells include a first set of memory pages that are accessed according to a first access speed and a second set of memory pages that are accessed according to a second access speed that is different from the first access speed, wherein the selected memory requests are requesting to access a sequential string of memory pages on a per page request basis, wherein the modulus is based, at least in part, on access speeds of the sequential string of memory pages, and wherein selecting the memory requests is based, at least in part, on the access speeds;

issuing the selected memory requests to be processed in parallel by the memory device, wherein the selected memory requests have a same access speed, wherein issuing the selected memory requests includes aligning the selected memory requests, wherein issuing the selected memory requests includes controlling the selected memory requests to be executed in parallel, and wherein selecting each of the memory requests is based, at least in part, on the arithmetic modulo result.

15. The method of claim 14, wherein the plurality of memory requests are requests to read or requests to program the memory pages of the memory device, wherein selecting the memory requests includes selecting memory requests of the plurality of memory requests that are access requests to multiple level cell (MLC) of the memory device, and the method further comprises:
determining an access speed tolerance, where one of the plurality of memory requests is issued that can be processed by the memory device in the access speed tolerance.

* * * * *